United States Patent
Cao

(10) Patent No.: US 8,044,471 B2
(45) Date of Patent: Oct. 25, 2011

(54) MOSFET HAVING A CHANNEL MECHANICALLY STRESSED BY AN EPITAXIALLY GROWN, HIGH K STRAIN LAYER

(75) Inventor: Min Cao, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 12/839,468

(22) Filed: Jul. 20, 2010

(65) Prior Publication Data
US 2010/0283109 A1   Nov. 11, 2010

Related U.S. Application Data

(62) Division of application No. 11/053,022, filed on Feb. 8, 2005, now Pat. No. 7,772,062.

(51) Int. Cl.
H01L 29/76 (2006.01)
(52) U.S. Cl. ......... 257/410; 257/406; 257/411
(58) Field of Classification Search ......... 257/410, 257/406, 411
See application file for complete search history.

(56) References Cited

U.S. PATENT DOCUMENTS

| | | |
|---|---|---|
| 4,288,470 A | 9/1981 | Bate et al. |
| 5,619,051 A | 4/1997 | Endo |
| 5,949,117 A | 9/1999 | Sandhu et al. |
| 6,133,605 A | 10/2000 | Kishi |
| 6,163,060 A | 12/2000 | Gardner et al. |
| 6,387,761 B1 | 5/2002 | Shih et al. |
| 6,429,061 B1 | 8/2002 | Rim |
| 6,528,856 B1 | 3/2003 | Bai et al. |
| 6,563,152 B2 | 5/2003 | Roberds et al. |
| 6,607,952 B1 | 8/2003 | Yagishita et al. |
| 6,627,519 B2 | 9/2003 | Kwon et al. |
| 6,723,581 B1 | 4/2004 | Chabal et al. |
| 6,784,506 B2 | 8/2004 | Xiang et al. |
| 6,956,267 B2 * | 10/2005 | Hattangady et al. .......... 257/411 |
| 7,045,847 B2 | 5/2006 | Lin et al. |
| 7,268,388 B2 | 9/2007 | Basceri et al. |
| 2002/0185697 A1 | 12/2002 | Kim |
| 2006/0148151 A1 | 7/2006 | Murthy et al. |

OTHER PUBLICATIONS

Nakajim, et al., "Low-temperature formation of silicon nitride gate dielectrics by atomic-layer deposition"; Applied Physics Letters, vol. 79, No. 5, Jul. 30, 2001.
Wong, "Thermal Stability and Electronic Structure of Hafnium and Zirconium Oxide Films for Nanoscale MOS Device Applications", 2004 IEEE, Nov. 3-5, 2004.
U.S. Appl. No. 11/053,022 of Min Cao, "MOSFET Having a Channel Mechanically Stressed by an Epitaxially Grown, High K. Strain Layer", filed Feb. 8, 2005.

* cited by examiner

Primary Examiner — Eugene Lee
(74) Attorney, Agent, or Firm — Duane Morris LLP; Won Joon Kouh

(57) ABSTRACT

A transistor, such a MOSFET, having an epitaxially grown strain layer disposed over a channel region of a substrate for stressing the channel region to increase the carrier mobility in the channel, and method for making same. The strain layer is composed of a high dielectric constant material.

12 Claims, 2 Drawing Sheets

MOSFET HAVING A CHANNEL MECHANICALLY STRESSED BY AN EPITAXIALLY GROWN, HIGH K STRAIN LAYER

RELATED APPLICATIONS

This application is a divisional of U.S. patent application Ser. No. 11/053,022, filed Feb. 8, 2005. The entire disclosure of U.S. patent application Ser. No. 11/053,022 is incorporated herein by reference.

FIELD OF INVENTION

The present invention relates to semiconductor structures and manufacturing. More particularly the invention relates to a method for mechanically stressing the channel of a metal-oxide-semiconductor transistor (MOSFET) to increase the carrier mobility in the channel.

BACKGROUND OF THE INVENTION

A conventional MOSFET generally includes a semiconductor substrate, such as silicon (Si), having a source, a drain, and a channel positioned between the source and drain. A gate structure, formed by a gate conductor layer and a gate insulator layer, may be disposed above the channel. The gate insulator layer is typically composed of an oxide material such as silicon dioxide ($SiO_2$) and the gate conductor layer is typically composed of polycrystalline silicon (poly Si).

Current flows through the channel of the MOSFET when an electric field is applied thereto. The amount of current flowing through the channel is, generally, directly proportional to the mobility of the carriers in the channel. Increasing the mobility of the carriers in the channel therefore increases the amount of current flowing through the channel. Circuits which utilize high mobility MOSFETs are capable of faster operation.

One method for increasing the mobility of the carriers in the channel of a MOSFET is to mechanically stress the channel. There are a number of known methods for mechanically stressing the channel of a MOSFET. One known method utilizes a strained Si layer which is grown on a relaxed Si1-xGex substrate. In another known method, a contact etch stop layer is used to mechanically stress the channel of a MOSFET. More specifically, a tensile capping contact etch stop layer induces strain in the channel, and improves NMOS channel mobility. In yet another known method, a SilxGex strain layer is selectively grown in the source/drain regions of the MOSFET to generate uni-axial compressive strain in the PMOS channel.

There are several disadvantages associated with these known methods. The MOSFET utilizing the strained Si layer grown over the relaxed Si1-xGex substrate is costly to fabricate and may exhibit crystal defects and poor heat conduction. The contact etch stop layer method requires a high level of stress and stress control. The Si1-xGex strain layer selectively grown in the source/drain regions significantly increases the cost of the MOSFET and potentially, can create junction leakage.

Accordingly, an alternative method for mechanically stressing the channel of a MOSFET is desired.

SUMMARY OF INVENTION

A transistor comprising a semiconductor substrate; a gate structure disposed over a region of the substrate to cause the region of the substrate to operate as a channel of the transistor; and a strain epi-layer disposed over the channel region of the substrate for stressing the channel region of the substrate. The strain epi-layer comprises a material with a high dielectric constant.

DETAILED DESCRIPTION OF THE INVENTION

Methods and structures are described below in which an epitaxially grown strain layer composed of a single-crystal, high dielectric constant (k) material or materials (materials having a dielectric constant greater than 3.9) is utilized to mechanically stress (tensile or compressive stress) the channel of a MOSFET. The high k material or materials selected for use as the strain layer each have a lattice constant which is different than that of the substrate in which the channel of the MOSFET is defined. The strain layer may be comprised of multiple layers of different high k materials, however, only the layer in contact with channel needs to be expitaxially grown. Stressing the channel of the MOSFET increases the carrier mobility within the channel, which increases the switching speed and operation of the MOSFET. The mechanical stress is induced by the resulting mismatch between the different lattice constants of the epitaxially grown high k strain layer and the underlying substrate material.

FIGS. 1-4 illustrate the fabrication of an exemplary embodiment of a MOSFET according to the present invention. Referring to the cross-sectional view of FIG. 1, there is shown a substrate 10 which will define the channel of the MOSFET. The substrate 10 may include, without limitation, silicon (Si), Germanium (Ge), SiGe, or silicon-on-insulator (SOI) or other suitable semiconductor materials. The substrate 10 may be doped at selected locations to form regions with various functionalities. In some embodiments, which utilize a substrate composed of Si, the substrate 10 may be doped to produce one or more p-type silicon regions using a dopant such as boron and/or like dopants. In other embodiments, the substrate 10 composed of Si may be doped to produce one or more n-type silicon regions using a dopant such as arsenic, phosphorous, and/or like dopants.

The substrate 10 may have shallow trench isolation structures 12 disposed therein. The shallow trench isolation structures 12 may be filled with a dielectric material such as silicon dioxide. Those skilled in the art will recognize that although shallow trench isolation structures are common in modern integrated circuits, such structures are not required to practice the present invention.

Figure 1:
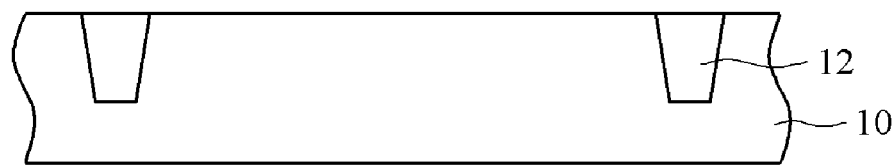
FIGS. 1-4 are cross-sectional views illustrating the fabrication of an exemplary embodiment of a MOSFET according to the present invention.
Figure 2:
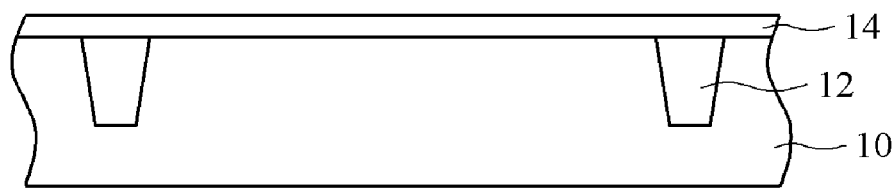

Referring to the cross-sectional view of the substrate 10 shown in FIG. 2, a thin, high k strain layer 14 is epitaxially grown on the surface of the substrate 10. The strain layer 14 may be a single or multiple layer structure. In general, the high k material or materials utilized for the one or more layers of the strain layer 14 are ones that may be epitaxially grown on the substrate 10 and which are capable, either singly or in combination, of mechanically distorting the lattice of the substrate in the region of the channel. Such high k materials may include, but are not limited to, metal oxides such as hafnium oxide (HfO2), zirconium oxide (ZrO2), tantalum oxide (Ta2O3), titanium oxide (TiO2), and yittrium oxide (Y2O3) to name a few. The high k material may also include silicon nitride (Si3N4) and titanates such as barium strontium titanate ((Ba1-xSrx)TiO3), and lead zirconium titanate (Pb(Zr0.47Ti0.53)O3 to name a few.

The high k material may be selected to optimize the amount and type of stress applied to the substrate, in accordance with the type of MOSFET, i.e., n-type or p-type, thus, allowing the switching speed of the MOSFET to be individually tuned. For example, in tuning a p-type MOSFET, it may be desirable to use a compressive type of mechanical stress to strain the channel of the MOSFET. Hence, the high k material selected for use as the strain layer 14 in a p-type MOSFET may be a material having a lattice constant greater than the substrate 10. In tuning an n-type MOSFET, it may be desirable to use a tensile type of mechanical stress to strain the channel of the MOSFET. Hence, the high k material selected for use as the strain layer 14 in an n-type MOSFET may be a material having a lattice constant less than the substrate 10.

The epitaxial process used for growing the high k strain layer may be a known epitaxial growth technique. Known epitaxial growth techniques may include, but are not limited to, techniques such as molecular beam epitaxy (MBE), atomic layer deposition (ALD) or chemical vapor deposition (CVD). MBE is a physical deposition process which essentially uses an evaporation method in a vacuum system. During MBE, one or more thermal beams of atoms or molecules react with a crystalline surface in ultra-high vacuum (usually below 10-8 torr) and at substrate temperature typically not exceeding 800° C. Because of the chemical cleanliness of the substrate surface and since the flow of species to be deposited is unobstructed, highly controlled growth of an ultra-thin epitaxial high k strain layer is possible.

The ALD process uses sequential deposition of individual monolayers or fractions of a monolayer in a carefully controlled manner. In ALD, the surface on which material is to be deposited is alternately exposed to only one of two complementary chemical environments. Individual precursors are supplied to the apparatus one at a time. Between exposure steps, an inert gas purge or vacuum step is performed to remove any residual chemically active gas or by-products before introducing another precursor. These individual growth cycles are repeated. During each exposure step, precursor molecules react with the surface until all available surface sites are saturated. Precursor chemistries and process conditions are chosen such that no further reaction takes place once the surface is completely saturated. This makes ALD independent of variations in such process parameters as the amount of precursor supplied to the surface, precursor flow rate, partial pressure and the like. The thickness of the material deposited in each layer is a constant defined by the chemistry, and may be, for example between 0.1 and 1.0 angstroms. The strain layer is grown monolayer-by-monolayer, and the total layer thickness is determined by the number of cycles. ALD can achieve very high uniformity in the layer thickness across the entire surface on which material is deposited.

The CVD process forms the epitaxial high k strain layer using a chemical reaction between gaseous compounds. During CVD, the gaseous reactants are transported to the surface of the substrate 10 where they are adsorbed. A chemical reaction occurs at the substrate surface which produces the epitaxial growth of the high k strain layer.

Figure 3:
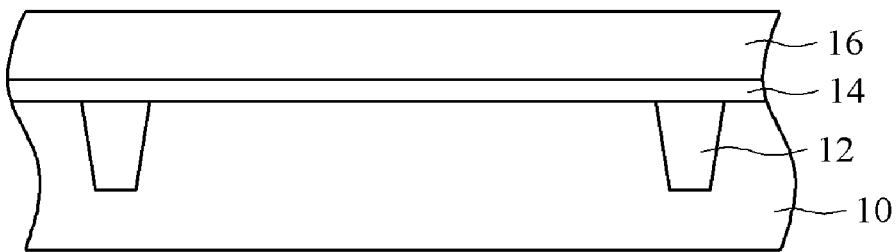

Referring to the cross-sectional view of FIG. 3, a gate conductor layer 16 is formed above the epitaxially grown high k strain layer 14. The gate conductor layer 16 may be formed by one or more layers of a conductive metal such as W, Pt, Co or Ti; polysilicon; a combination of polysilicon and a conductive metal; or other like conductive materials. The gate conductor layer 16 may be formed conventionally using known methods.

Figure 4:
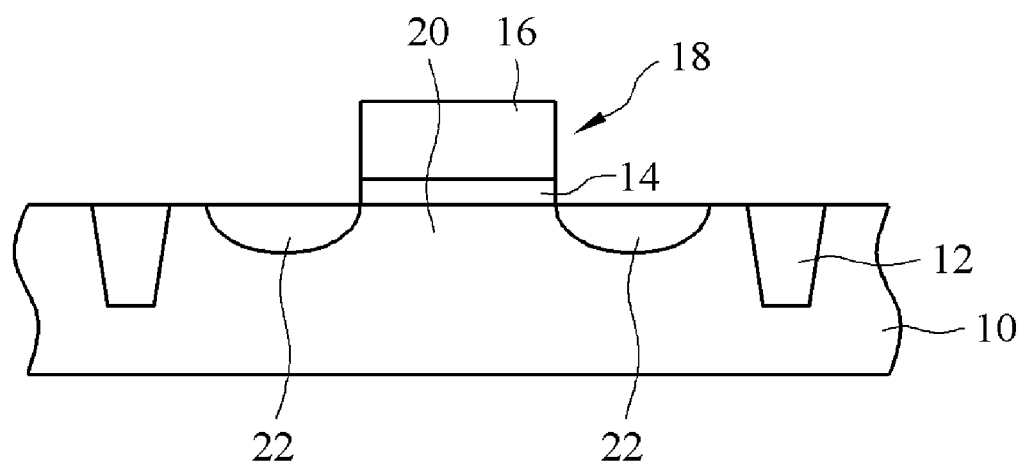

As shown in the cross-section view of FIG. 4, the gate conductor layer 16 and the epitaxially grown high k strain layer 14 may be patterned to form a gate stack 18 and source/drain regions 22 may then be formed at ends of channel 20 using conventional impurity doping methods. P-type dopants including boron and/or other like dopants may be used to form the source/drain regions 22 of p-type MOSFETs and n-type dopants including arsenic, phosphorous, and/or other like dopants may be used to form the source/drain regions 22 of n-type MOSFETs.

Although not shown, those skilled in the art will appreciate that sidewall spacers may be formed adjacent to the gate stack to aid in the control of source/drain terminal formation. The sidewall spacers may be formed conventionally from a known spacer material such as silicon nitride.

As illustrated in the exemplary embodiment described above, the epitaxially grown high k strain layer 14 is formed directly on the substrate 10 and no gate insulator is used under the gate conductor layer 16. Since the strain layer 14 is suitable for use as a gate insulator layer, the strain layer 14 in this embodiment also functions as a component of the gate structure, i.e., the gate insulator layer.

Figure 5:
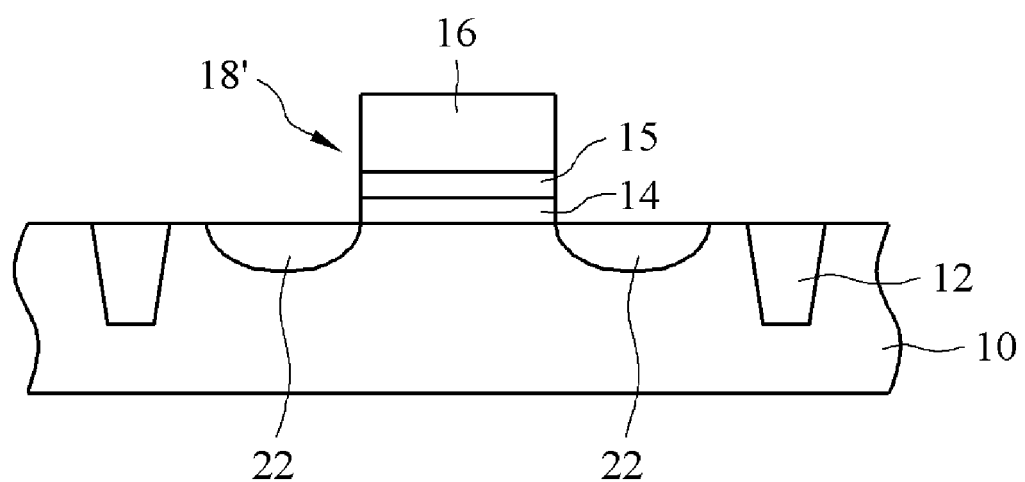
FIG. 5 is a cross-sectional view illustrating another exemplary embodiment of a MOSFET according to the present invention.

In an alternative exemplary embodiment, as illustrated in the cross-sectional view of FIG. 5, a gate insulator layer 15 may be deposited over the high k strain layer 14 of gate stack 18'.

The thickness of the high k strain layer varies depending upon the actual k value of the high k material used, device requirements, and other material properties. Many MOSFETs are fabricated with silicon dioxide gate insulator layers having a gate insulator layer thickness ranging between about 10 angstroms and about 100 angstroms. The strain layer of the present invention with its higher k value will typically have a gate insulator thickness range below that of gate insulator layers made of silicon dioxide.

While the foregoing invention has been described with reference to the above, various modifications and changes can be made without departing from the spirit of the invention. Accordingly, all such modifications and changes are considered to be within the scope of the appended claims.

What is claimed is:

1. A transistor comprising:
   a semiconductor substrate;
   a gate conductor layer disposed over a region of the substrate to cause the region of the substrate to operate as a channel of the transistor;
   a strain epi-layer disposed over the channel region of the substrate for stressing the channel region of the substrate, the strain epi-layer comprising a metal oxide or a titanate material with a high dielectric constant; and
   a silicon dioxide gate insulator layer disposed between the strain epi-layer and the gate conductor layer.

2. The transistor according to claim 1, wherein the transistor comprises a metal-oxide-semiconductor field effect transistor (MOSFET).

3. The transistor according to claim 2, wherein the stress comprises a compressive stress.

4. The transistor according to claim 3, wherein the MOSFET comprises a p-type MOSFET.

5. The transistor according to claim 2, wherein the stress comprises a tensile stress.

6. The transistor according to claim 5, wherein the MOSFET comprises an n-type MOSFET.

7. The transistor according to claim 1, wherein the material of the strain epi-layer has a lattice constant which is greater than a lattice constant of the substrate.

8. The transistor according to claim 1, wherein the material of the strain epi-layer has a lattice constant which is less than a lattice constant of the substrate.

9. The transistor according to claim 1, wherein the substrate comprises one of silicon, germanium, silicon germanium, and silicon-on-insulator.

10. The transistor according to claim 1, wherein the metal oxide includes one of hafnium oxide, zirconium oxide, tantalum oxide, titanium oxide, and yittrium oxide.

11. The transistor according to claim 1, wherein the titanate includes one of barium strontium titanate and lead zirconium titanate.

12. The transistor according to claim 1, wherein the material of the strain layer comprises a single crystal.

\* \* \* \* \*